US010862449B2

(12) United States Patent
Valzasina et al.

(10) Patent No.: US 10,862,449 B2
(45) Date of Patent: Dec. 8, 2020

(54) MICROELECTROMECHANICAL RESONATOR SYSTEM WITH IMPROVED STABILITY WITH RESPECT TO TEMPERATURE VARIATIONS

(71) Applicant: STMicroelectronics S.r.l., Agrate Brianza (IT)

(72) Inventors: Carlo Valzasina, Gessate (IT); Gabriele Gattere, Castronno (IT); Alessandro Tocchio, Milan (IT); Giacomo Langfelder, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 77 days.

(21) Appl. No.: 16/171,885

(22) Filed: Oct. 26, 2018

(65) Prior Publication Data

US 2019/0131952 A1    May 2, 2019

(30) Foreign Application Priority Data

Oct. 31, 2017  (IT) ........................ 102017000124320

(51) Int. Cl.
*H03H 9/02* (2006.01)
*H03B 5/30* (2006.01)
(Continued)

(52) U.S. Cl.
CPC .......... *H03H 9/02448* (2013.01); *H03B 5/04* (2013.01); *H03B 5/30* (2013.01); *H03H 9/02259* (2013.01);
(Continued)

(58) Field of Classification Search
CPC .......... H03H 9/02448; H03H 9/02259; H03H 9/02338; H03B 5/04; H03B 5/30; H03L 1/027; H03L 7/1976
See application file for complete search history.

(56) References Cited

U.S. PATENT DOCUMENTS 9,318,998 B1 *  4/2016  Tabrizian ............... H03B 5/323
9,494,472 B2   11/2016  Le Traon et al.
(Continued)

OTHER PUBLICATIONS

Azcondo et al., "New Digital Compensation Technique for the Design of a Microcomputer Compensated Crystal Oscillator," *IEEE Transactions on Industrial Electronics* 42(3):307-315, Jun. 1995.
Gronicz et al., "A 2 µA Temperature Compensated MEMS-based Real Time Clock with ±4ppm Timekeeping Accuracy," IEEE International Symposium on Circuits and Systems (ISCAS), Jun. 1-5, 2014, Melbourne, Australia, pp. 514-517.
(Continued)

*Primary Examiner* — Samuel S Outten
(74) *Attorney, Agent, or Firm* — Seed IP Law Group LLP

(57) ABSTRACT

A MEMS resonator system has a micromechanical resonant structure and an electronic processing circuit including a first resonant loop that excites a first vibrational mode of the structure and generates a first signal at a first resonance frequency. A compensation module compensates, as a function of a measurement of temperature variation, a first variation of the first resonance frequency caused by the temperature variation to generate a clock signal at a desired frequency that is stable relative to temperature. The electronic processing circuit further includes a second resonant loop, which excites a second vibrational mode of the structure and generates a second signal at a second resonance frequency. A temperature-sensing module receives the first and second signals and generates the measurement of temperature variation as a function of the first variation of the first resonance frequency and a second variation of the second resonance frequency caused by the temperature variation.

18 Claims, 7 Drawing Sheets

(51) Int. Cl.
 *H03B 5/04* (2006.01)
 *H03L 1/02* (2006.01)
 *H03L 7/197* (2006.01)
 *H03H 9/24* (2006.01)

(52) U.S. Cl.
 CPC ......... *H03H 9/02338* (2013.01); *H03L 1/027* (2013.01); *H03L 7/1976* (2013.01); *H03H 9/2463* (2013.01); *H03H 2009/02496* (2013.01)

(56) References Cited

U.S. PATENT DOCUMENTS

| | | |
|---|---|---|
| 2005/0285692 A1 | 12/2005 | Mattila et al. |
| 2007/0024158 A1 | 2/2007 | Bourgeois |
| 2007/0290764 A1* | 12/2007 | Partridge ................ H03L 1/022 331/176 |
| 2010/0289096 A1 | 11/2010 | Casset et al. |
| 2014/0285270 A1 | 9/2014 | Montagne |

OTHER PUBLICATIONS

Kaajakari et al., "Square-Extensional Mode Single-Crystal Silicon Micromechanical RF-resonator," the 12$^{th}$ International Conference on Solid State Sensors, Actuators, and Microsystems, Jun. 8-12, 2003, Boston, MA, pp. 951-954.

Koskenvuori et al., "Temperature Measurement and Compensation Based on Two Vibrating Modes of a Bulk Acoustic Mode Microresonator," MEMS 2008, Jan. 13-17, 2008, Tucson, AZ, pp. 78-81.

Melamud et al., "Temperature-Insensitive Composite Micromechanical Resonators," *Journal of Microelectromechanical Systems* 18(6):1409-1419, Dec. 2009.

Ng et al., "Temperature Dependence of the Elastic Constants of Doped Silicon," *Journal of Microelectromechanical Systems* 24(3): 730-741, Jun. 2015.

Schodowski, "Resonator Self-Temperature-Sensing Using a Dual-Harmonic-Mode Crystal Oscillator," 43$^{rd}$ Annual Symposium on Frequency Control, 1989, 6 pages.

* cited by examiner

MICROELECTROMECHANICAL RESONATOR SYSTEM WITH IMPROVED STABILITY WITH RESPECT TO TEMPERATURE VARIATIONS

BACKGROUND

Technical Field

The present disclosure relates to a MEMS (Micro-Electro-Mechanical Structure) resonator system, having improved stability with respect to temperature variations.

Description of the Related Art

In particular, MEMS resonator systems are advantageously used for RTC (Real-Time Clock) devices, to which the following discussion will make reference without this implying any loss of generality.

As it is known, RTC devices are commonly used with clock function within electronic apparatuses, whether portable or not, such as mobile phones, cameras, automotive apparatuses, electrical household appliances, data-collection terminals, smart-card readers, etc., in order to count passage of real time (in terms of years, months, days, hours, minutes, and seconds) even when the corresponding electronic apparatuses are off.

An RTC device generally includes for this purpose: a resonator system, designed to generate an operating (or resonance) frequency, for example equal to, or a multiple of, a desired value, for instance 32.768 kHz; an electronic module, coupled to the resonator system, for counting the passage of time on the basis of this operating frequency; and a suitable supply source for providing electric power supply.

Even though quartz technology has for decades dominated the field of frequency generation (also for RTC applications), MEMS resonator systems made with semiconductor technologies, in particular silicon-based ones, have recently been proposed, with ever-increasing success.

The advantages linked to the use of MEMS resonator systems are represented above all by a marked decrease of the dimensions and by the considerable reduction in costs, thanks to the possibility of using standard manufacturing processes of integrated circuits, and to the possibility of low-cost integration in a same chip of semiconductor material both of the micromechanical structure and of the corresponding electronic processing circuit (in the form of an ASIC—Application-Specific Integrated Circuit). Further, MEMS resonator systems are generally more resistant to impact and to mechanical stresses, and have electrical consumption levels lower than traditional quartz solutions.

MEMS resonator systems include micromechanical resonant structures obtained by micromachining techniques, which, as a consequence of external stresses (in the form of suitable DC electrical biasing and AC driving signals), are induced to vibrate at their natural resonance frequency. These micromechanical resonant structures typically include at least one mobile mass, anchored to a substrate by purposely provided constraint elements, which is driven into a resonance movement by the applied biasing and driving signals.

FIG. 1 is a schematic illustration of a MEMS resonator system 1, which includes a micromechanical resonant structure 2 and a coupled electronic processing circuit 4, obtained as an ASIC; in a possible embodiment, the micromechanical resonant structure 2 and the electronic processing circuit 4 are each obtained in a respective die of semiconductor material, in particular silicon, and are housed within a same package to define an integrated system (chip).

The micromechanical resonant structure 2 includes a mobile mass (the so-called rotor) 5, capacitively coupled to a drive electrode (D) 6 and to a sense electrode (S) 7.

The electronic processing circuit 4 implements a self-sustaining resonant loop (with positive feedback) and in particular supplies a driving signal $V_{ac}$ (in particular an AC voltage at a resonance frequency of the micromechanical resonant structure 2) to the drive electrode 6, which causes resonance vibration of the mobile mass 5 (which is biased at a biasing voltage $V_{bias}$, in particular a DC voltage); and receives a sensing signal $S_{out}$ associated with the capacitance variation, due to the resonance vibration, of the capacitor formed between the sense electrode 7 and the mobile mass 5.

The electronic processing circuit 4 includes an amplifier stage 8 (including, for example, a current-to-voltage converter stage with gain Gm), which receives the sensing signal $S_{out}$ and converts it into a signal at the resonance frequency (applying an appropriate amplification for compensating the losses of the micromechanical resonant structure 2), this signal further defining the driving signal $V_{ac}$ for sustaining, in the positive feedback, the resonant vibration of the micromechanical resonant structure 2.

The electronic processing circuit 4 further includes an output stage 9, including, for example, a buffer or driver module, coupled to the output of the amplifier stage 8 and designed to supply an output signal $S(f_{out})$ at an operating frequency $f_{out}$ of a desired value, based on the resonance frequency of the micromechanical resonant structure 2; the output signal $S(f_{out})$ is, for example, constituted by a pulse train at the aforesaid operating frequency $f_{out}$.

FIG. 2 shows a possible embodiment of the micromechanical resonant structure 2, of the so-called "double-clamped" or "clamped-clamped" type.

The mobile mass 5 is constituted by a deflecting beam of length L, which extends longitudinally along a first horizontal axis x, is arranged suspended above a substrate, parallel to a top surface of the same substrate lying in a horizontal plane xy, and is constrained at both ends to respective anchorages 12, fixed with respect to the substrate (the anchorages being constituted, for example, by column or pillar structures extending vertically from the top surface of the substrate up to a respective end of the mobile mass 5).

The drive electrode 6 and the sense electrode 7 are arranged facing, and parallel to, the mobile mass 5, on opposite sides of the mobile mass 5 along a second horizontal axis y (which defines, together with the first horizontal axis x the aforesaid horizontal plane xy), and have a length substantially equal to the length L of the beam of the mobile mass 5. The drive electrode 6 and the sense electrode 7 are anchored to the substrate, being, for example, fixedly coupled to the top surface of the substrate by a respective anchorage, for instance shaped like a column or pillar of semiconductor material, arranged, for example, in a central position with respect to their extension.

During operation, application of the driving signal $V_{ac}$ between the drive electrode 6 and the mobile mass 5 causes a movement of deformation by deflection of the corresponding beam in the direction of the second horizontal axis y, and a consequent variation of the capacitive coupling with the sense electrode 7, with generation of the sensing signal $S_{out}$, which may thus be detected and appropriately processed by the electronic processing circuit 4.

Typically, the driving signal $V_{ac}$, applied to the mobile mass 5 by the drive electrode 6, is such as to excite the first vibrational mode of the mobile mass 5, the plot of which along the second horizontal axis y versus the normalized length $\overline{L}$ of the deflecting beam, is represented in FIG. 3 in the case of the double-clamped structure of FIG. 2.

The resonance frequency $f_1$ associated with the first vibrational mode may be expressed via the following equation:

$$\omega_1 = (\beta_1 \cdot L)^2 \sqrt{\frac{E \cdot I}{\rho \cdot A \cdot L^4}}$$

wherein $\omega_1 = 2\pi f_1$, is Young's modulus associated with the mobile mass 5 of the micromechanical resonant structure 2, I is the moment of inertia, $\rho$ is the density of the material, A is the area of the cross-section of the deflecting beam of the mobile mass 5, and $\beta_1$ is a constant associated with the first vibrational mode (the product $\beta_1 \cdot L$ is, for example, equal to 4.73 in the case of the double-clamped structure of FIG. 2, made of silicon).

In a known manner, the stability of the resonance frequency is a fundamental aspect of a MEMS resonator system 1; for example, in the case of use for a resonant accelerometer, the resonance frequency directly affects the sensitivity of the sensor, whereas in the case of use in an RTC device, the stability of the resonance frequency represents directly the figure of merit of the device.

However, the resonance frequency of a MEMS resonator system 1, as highlighted by the previous equation, is directly proportional to the square root of the Young's modulus E, and it is known that the value of Young's modulus E varies as the temperature varies.

For instance, it is known that the value of Young's modulus E, in particular for monocrystalline silicon [100], varies with temperature according to the following expression:

$$E(T) = E_0 \cdot (1 + TCE_1 \cdot \Delta T + TCE_2 \cdot \Delta T^2) + TCE_2 \cdot \Delta T^2)$$

wherein $E_0$ is the Young's modulus at a reference temperature $T_0$, $TCE_1$ and $TCE_2$ are temperature-variation coefficients, equal respectively to $-63$ ppm/° C. and $-56.47$ ppb/° C.$^2$, and $\Delta T$ is the temperature variation.

It may be shown that the consequent variation of the resonance frequency $f_1$ may be expressed by the following expression:

$$\Delta f_1 = TCf_1 \cdot \Delta T = \alpha \cdot f_{0,1} \cdot \Delta T$$

wherein $TCf_1$ is the so-called temperature coefficient of frequency, $f_{0,1}$ is the reference value of the resonance frequency of the first vibrational mode at the reference temperature $T_0$ (e.g., at room temperature), and the coefficient $\alpha$ (representing the percentage variation of frequency with temperature), depending on the semiconductor material, is for example approximately $-30$ ppm/° C. in the case of silicon. A variation of frequency, for example of +/−1500 ppm, over an entire temperature range of use, in the example +/−50° C., may thus arise.

Several solutions have been proposed in an attempt to solve the problem of the variation of the resonance frequency value as a function of temperature, but none of them has proven to be altogether satisfactory, in particular for applications in RTC devices, i.e., devices that require a high stability.

For instance, a first solution of a known type, described, for example, in J. Gronicz, M. Pulkkinen, M. Yücetaş, K. Halonen, "A 2 µA temperature-compensated MEMS-based real time clock with ±4 ppm timekeeping accuracy", Circuits and Systems (ISCAS), 2014 IEEE International Symposium, Jun. 1-5, 2014, envisages the use of a temperature sensor, operatively coupled to the micromechanical resonant structure 2 for supplying to the associated electronic processing circuit 4 information on the operating temperature, on which to base appropriate operations of compensation of the variations of the resonance frequency value.

The present Applicant has, however, realized that this solution, in addition to increasing the complexity of the electronic processing circuit 4, is not altogether satisfactory and has certain important limitations.

In particular, these limitations are linked to the accuracy of the temperature sensor used, which may not prove sufficient for compensating the variations of the resonance frequency with temperature.

In this regard, it is emphasised that a temperature-compensated real-time clock oscillator (TCXO) is required to have a stability of the value of the clock frequency of around +/−5 ppm over the entire temperature range of use (e.g., +/−100° C.); it is possible to show that an uncertainty of +/−0.2° C. in the measurement of temperature is sufficient to exceed the pre-set target of stability of the clock frequency.

Furthermore, the uncertainty in the measurement of temperature may derive not only from the accuracy of the temperature sensor being used, but also from possible differences of temperature between the temperature sensor and the micromechanical resonant structure 2, given that the temperature sensor is physically distinct and separate from the same micromechanical resonant structure 2.

Another solution that has been proposed (see, for example, Eldwin J. Ng, Vu A. Hong, Yushi Yang, Chae Hyuck Ahn, Camille L. M. Everhart, Thomas W. Kenny, "Temperature Dependence of the Elastic Constants of Doped Silicon," Journal Of Microelectromechanical Systems, Vol. 24, No. 3, June, 2015, envisages the use of a layer of single-crystal silicon (SC S) with high doping for forming the micromechanical resonant structure 2.

It has in fact been shown that high doping stresses the crystal lattice and shifts the electron energy bands, causing a flow of charge carriers in order to minimise the free energy, thus modifying the elastic properties of the material and in particular obtaining a reduction of the temperature coefficient of frequency TCf.

However, it may be shown that the aforesaid reduction of the temperature coefficient of frequency TCf is effective for some excitation modes of the resonant structure, for example for deformations due to elongation, whereas it is less effective for other excitation modes, for example for deformations due to deflection.

Also this solution is thus not altogether satisfactory and, for example, does not enable a sufficient compensation of the variation of the resonance frequency with temperature in the case of resonant structures that operate in deflection (as, for example, the structure of a double-clamped type of FIG. 1).

A further solution that has been proposed—see, for example, Renato Melamud, Saurabh A. Chandorkar, Bongsang Kim, Hyung Kyu Lee, James C. Salvia, Gaurav Bahl, Matthew A. Hoperoft, Thomas W. Kenny, "Temperature-Insensitive Composite Micromechanical Resonators," Journal of Microelectromechanical Systems, Vol. 18, No. 6, December, 2009—envisages forming the micromechanical resonant structure 2 with a silicon layer and, in addition, with a layer of material having a different temperature coefficient of expansion (TCE), such as to compensate the dependence of the frequency upon temperature. In particular, it has been proposed to coat the silicon layer with a thin layer of silicon oxide ($SiO_2$).

Also this solution is not, however, exempt from limitations. In particular, the additional coating, for example of silicon oxide, modifies in an irregular way the gaps from the drive and sense electrodes, contributing to worsening the spreads of the gap values and thus worsening the electrical performance. Further, the additional thin layer reduces the strength of the structure and its reliability, for example in case of impact or other kinds of mechanical shock.

The solutions that have so far been proposed for compensating the variations of the resonance frequency with temperature for MEMS resonator systems are thus not altogether satisfactory.

BRIEF SUMMARY

An aim of the present disclosure is to provide a MEMS resonator system having improved electrical characteristics, in particular as regards resonance frequency stability.

BRIEF DESCRIPTION OF THE SEVERAL VIEWS OF THE DRAWINGS

For a better understanding of the present disclosure, preferred embodiments thereof are now described purely by way of non-limiting example and with reference to the attached drawings, wherein.

DETAILED DESCRIPTION

As will be described in detail hereinafter, an aspect of the present solution envisages, in order to implement a compensation of the variation with temperature of the resonance frequency, to exploit the different variations of the temperature coefficient of frequency TCf of different vibrational modes of the micromechanical resonant structure.

Figure 1:
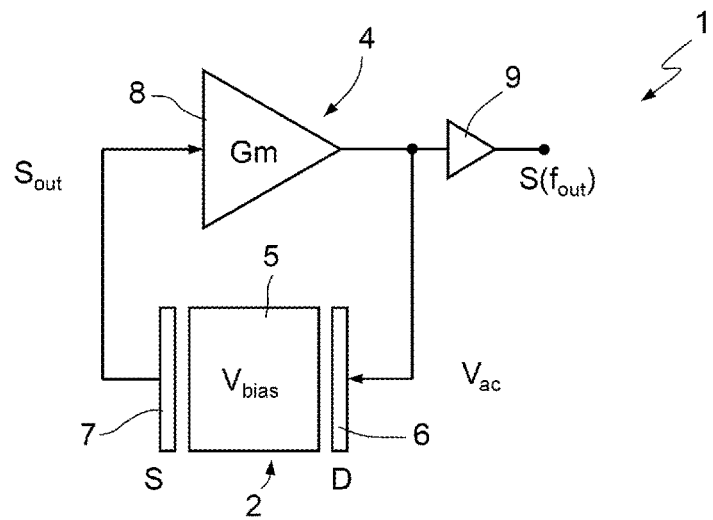
FIG. 1 is a block diagram of a MEMS resonator system of a known type.
Figure 4:
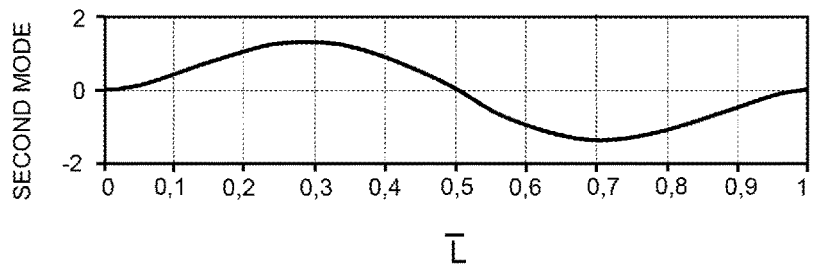
FIGS. 4 and 5 are diagrams representing the second vibrational mode and the third vibrational mode, respectively, of the micromechanical resonant structure.
Figure 5:
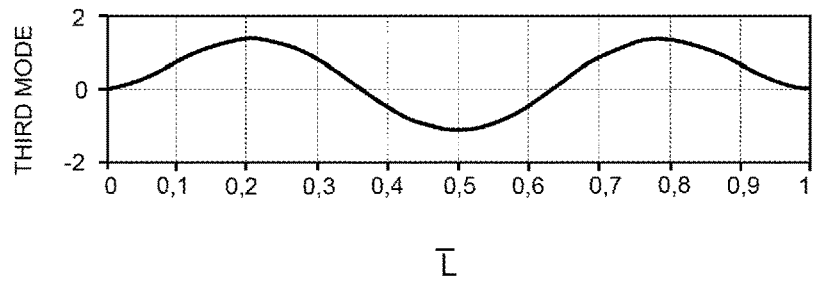

With reference, by way of example, to a micromechanical resonant structure of a double-clamped type, similar, for instance, to the one illustrated in FIG. 1, it is possible to consider, by way of example, the second vibrational mode, the plot of which is illustrated in FIG. 4, and the third vibrational mode, the plot of which is shown in FIG. 5.

In particular, considering the generic resonance frequency $f_i$ of the i-th vibrational mode, the equation previously shown becomes:

$$\omega_i = (\beta_i \cdot L)^2 \sqrt{\frac{E \cdot I}{\rho \cdot A \cdot L^4}}$$

wherein $\beta_i \cdot L$ varies for the different vibrational modes, determining different values of the resonance frequency $f_i$.

Further, the temperature coefficient of frequency TCf is itself different for the various vibrational modes, on the basis of the following expression:

$$TC_{f,i} = \alpha \cdot f_{0,i}$$

wherein $f_{0,i}$ is the value of the i-th resonance frequency at the reference temperature (determined on the basis of the previous equation), whereas the coefficient $\alpha$ is the same for the various vibrational modes (e.g., −30 ppm/° C. for silicon).

Consequently, the table of values appearing below may be obtained, considering again, by way of example, only the first three vibrational modes of a same micromechanical resonant structure (evidently these values are provided purely by way of example).

| Mode | $\beta_i \cdot L$ | $f_{0,i}$ [kHz] | TCf [Hz/° C.] |
|---|---|---|---|
| 1 | 4.73 | 524 | −15.72 |
| 2 | 7.85 | 1440 | −43.33 |
| 3 | 10.99 | 2831.5 | −84.95 |

As the temperature T varies, on account of the different value of the temperature coefficient of frequency TCf for the various vibrational modes, different variations of the corresponding resonance frequencies thus arise.

In particular, considering, by way of example, the first and second vibrational modes, the following equations are obtained:

$$\Delta f_1 = f_{\Delta T,1} - f_{0,1} = f_{0,1} + TCf_1 \cdot \Delta T - f_{0,1} = TCf_1 \cdot \Delta T = \alpha \cdot f_{0,1} \cdot \Delta T$$

$$\Delta f_2 = f_{\Delta T,2} - f_{0,2} = f_{0,2} + TCf_2 \cdot \Delta T - f_{0,2} = TCf_2 \cdot \Delta T = \alpha \cdot f_{0,2} \cdot \Delta T$$

wherein $\Delta T$ is the variation of the temperature T with respect to the reference temperature $T_0$, and $\Delta f_i$ is the consequent variation of resonance frequency of the i-th mode with respect to the value assumed at the reference temperature.

Considering now the difference between the frequency variations $\Delta f_1$ and $\Delta f_2$ associated with the first and second vibrational modes, the following expression is obtained:

$$\Delta f_{1-2} = \Delta f_1 - \Delta f_2 = (TCf_1 - TCf_2) \cdot \Delta T = \alpha \cdot (f_{0,1} - f_{0,2}) \cdot \Delta T$$

Figure 6:
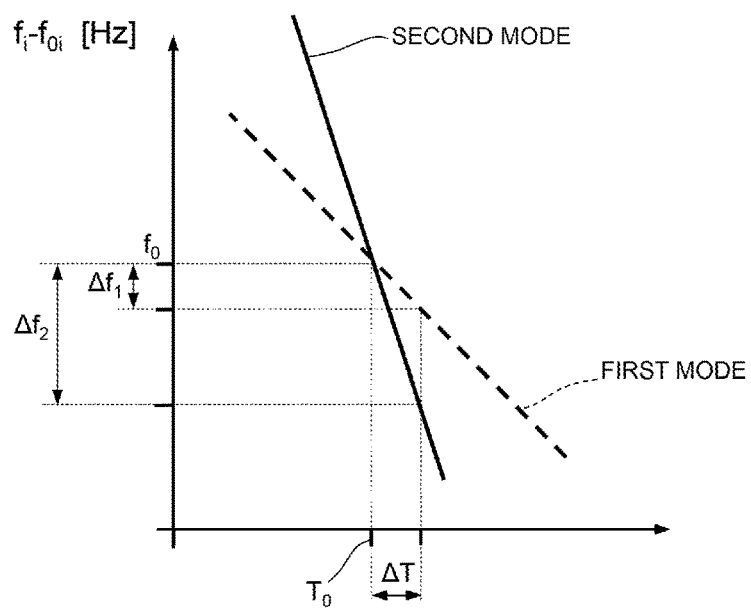
FIG. 6 is a plot representing the variations of the resonance frequency as a function of temperature.

FIG. 6 shows the aforesaid frequency variations $\Delta f_1$ and $\Delta f_2$ of the first and second vibrational modes, associated with a same temperature variation $\Delta T$.

Consequently, from the measurement of the difference between the frequency variations $\Delta f_1$ and $\Delta_2$ associated with two different vibrational modes, in the example associated with the first and second vibrational modes, it is possible to obtain a measurement of the temperature (in particular, a measurement of the temperature variation ΔT with respect to the reference temperature $T_0$), according to the following expression:

$$\Delta T = \frac{\Delta f_1 - \Delta f_2}{\alpha \cdot (f_{0,1} - f_{0,2})}$$

wherein the coefficient α is known, in so far as it depends on the semiconductor material (e.g., is equal to 30 ppm/° C. for silicon), and the terms $f_{0,1}$ and $f_{0,2}$ are also known in so far as they may be measured during characterization of the MEMS resonator system. In particular, the coefficient α is a known parameter that has a very reduced spread, being related to uniformity of the intrinsic characteristics of the structural material, and the terms $f_{0,1}$ and $f_{0,2}$ may be measured with a high degree of precision during the calibration step.

It follows that, from the aforesaid measurement of frequency difference, it is possible to obtain directly a measurement of the operating temperature of the MEMS resonator system, in a very precise manner and, in particular, without use of a dedicated temperature sensor.

Figure 7:
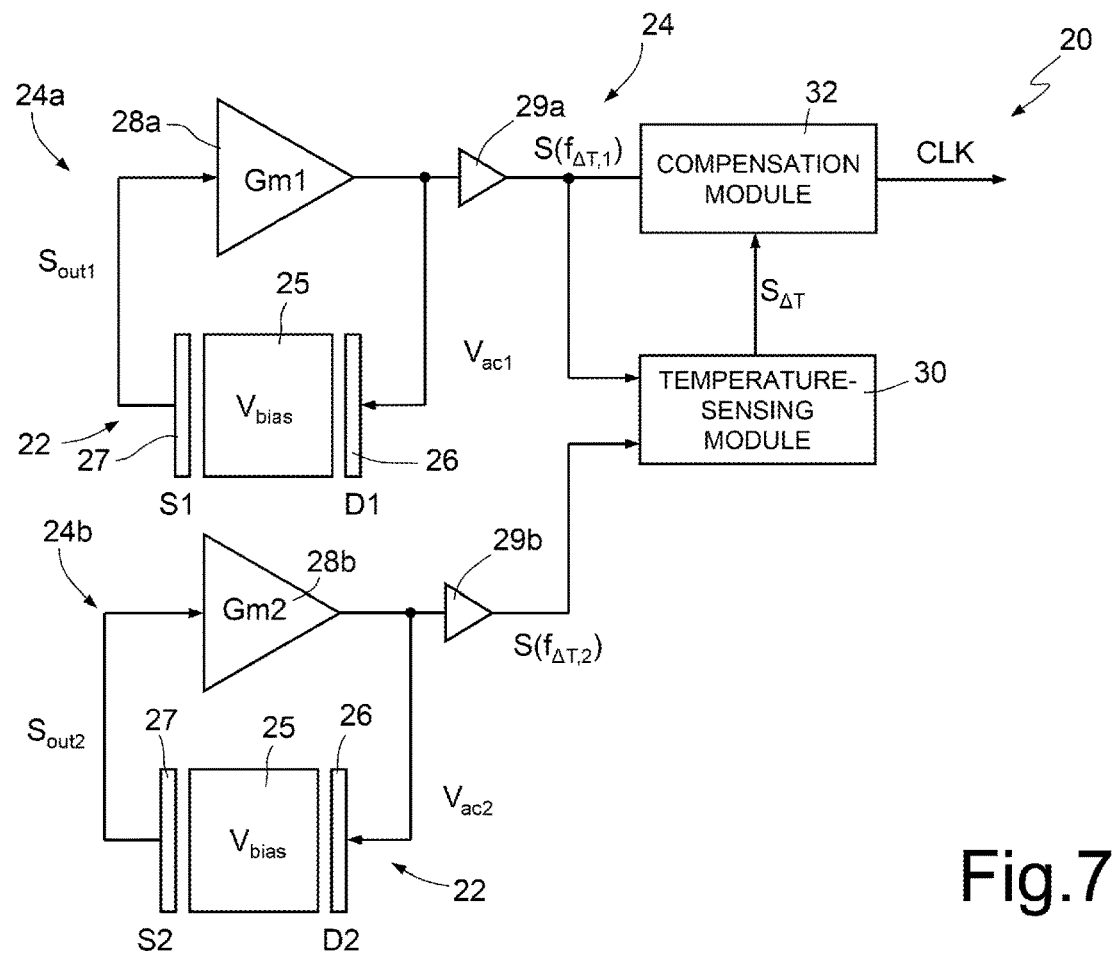
FIG. 7 is a schematic block diagram of a MEMS resonator system according to an embodiment of the present solution.

With reference to FIG. 7, a description of a MEMS resonator system 20 according to an embodiment of the present solution is now made, which implements the compensation methodology described previously.

The MEMS resonator system 20 includes a micromechanical resonant structure 22 and an electronic processing circuit 24, coupled to the micromechanical resonant structure 22. As mentioned previously, the micromechanical resonant structure 22 and the electronic processing circuit 24 may be integrated in respective dies of semiconductor material, in particular silicon, and these dies may be housed in a same package.

The micromechanical resonant structure 22, here illustrated in a schematic way, is provided with a corresponding mobile structure 25 and with associated drive electrodes 26 and sense electrodes 27, capacitively coupled to the mobile structure 25; for example, the mobile structure 25 may be of the so-called double-clamped or clamped-clamped type.

According to one aspect of the present solution, the electronic processing circuit 24 includes a first and a second self-sustaining resonant loop 24a, 24b (with positive feedback), which are distinct from one another and are both coupled to the micromechanical resonant structure 22.

The first and second resonant loops 24a, 24b are configured to excite a first resonant vibrational mode and a second resonant vibrational mode, respectively, that are associated with the micromechanical resonant structure 22 and thus generating a respective first output signal $S(f_{\Delta T,1})$ and second output signal $S(f_{\Delta T,2})$ at a first resonance frequency $f_{\Delta T,1}$ and a second resonance frequency $f_{\Delta T,2}$; the first and second output signals $S(f_{\Delta T,1})$, $S(f_{\Delta T,2})$ are, for example, constituted by a pulse train at the respective first and second resonance frequencies $f_{\Delta T,1}$, $f_{\Delta T,2}$.

In a possible embodiment, the first and second resonance frequencies $f_{\Delta T,1}$, $f_{\Delta T,2}$ are associated with the first and second vibrational modes of the micromechanical resonant structure 22; as discussed previously, the values of the first and second resonance frequencies $f_{\Delta T,1}$, $f_{\Delta T,2}$ vary as a function of temperature variation ΔT, in particular undergoing respective frequency variations $\Delta f_1$ and $\Delta_2$. In general, it should be noted that the aforesaid first and second resonance frequencies $f_{\Delta T,1}$, $f_{\Delta T,2}$ may be associated with two different vibrational modes of the structure, for example to the first and sixth vibrational modes (in the case wherein the other modes are out of the plane and torsional).

In detail, the first resonant loop 24a is configured to: generate a first driving signal $V_{ac1}$ (in particular, an AC voltage at the first resonance frequency $f_{\Delta T,1}$) and supplying said first driving signal $V_{ac1}$ to a first arrangement of drive electrodes (designated by D1) in order to excite resonance vibration of the mobile structure 25 (which is biased at a biasing voltage $V_{bias}$, in particular a DC voltage); and receive from a first arrangement of sense electrodes (designated by S1) a first sensing signal $S_{out1}$ associated with the vibration at the first resonance frequency $f_{\Delta T,1}$ of the mobile structure 25.

Likewise, the second resonant loop 24b is configured to: generate a second driving signal $V_{ac2}$ (in particular, an AC voltage at the second resonance frequency $f_{\Delta T,2}$) and supplying said second driving signal $V_{ac2}$ to a second arrangement of drive electrodes (designated by D2), distinct from the first arrangement of drive electrodes, in order to excite resonance vibration of the mobile structure 25; and receive from a second arrangement of sense electrodes (designated by S2) a second sensing signal $S_{out2}$ associated with the vibration at the second resonance frequency $f_{\Delta T,2}$ of the mobile structure 25.

In particular, the first and second resonant loops 24a, 24b include: a respective amplifier stage 28a, 28b (including, for example, a current-to-voltage converter stage with respective gain Gm1, Gm2), which receives the respective sensing signal $S_{out1}$, $S_{out2}$ and converts it into a signal at the respective resonance frequency $f_{\Delta T,1}$, $f_{\Delta T,2}$ (applying an appropriate amplification for compensating the losses of the micromechanical resonant structure 22), which further represents the respective driving signal $V_{ac1}$, $V_{ac2}$ for sustaining, with positive feedback, the resonant vibration of the micromechanical resonant structure 22; and a respective output stage 29a, 29b, which includes, for example, a buffer module or driver, coupled to the output of the respective amplifier stage 28a, 28b and designed to supply the first output signal $S(f_{\Delta T,1})$ and the second output signal $S(f_{\Delta T,2})$, respectively, at the first and second resonance frequencies $f_{\Delta T,1}$ and $f_{\Delta T,2}$ (for example, comprising a respective pulse train).

The electronic processing circuit 24 further includes a temperature-sensing module 30, coupled to the outputs of the first and second resonant loops 24a, 24b, in particular to the respective output stages 29a, 29b, for receiving the first and second output signals $S(f_{\Delta T,1})$, $S(f_{\Delta T,2})$ at the first and second resonance frequencies $f_{\Delta T,1}$ and $f_{\Delta T,2}$.

The temperature-sensing module 30 is configured so as to carry out a measurement of the operating temperature of the MEMS resonator system 20, in particular a measurement of the temperature variation ΔT with respect to a reference temperature $T_0$ on the basis of the values of the first and second resonance frequencies $f_{\Delta T,1}$ and $f_{\Delta T,2}$, in particular as a function of a difference between the respective frequency variations $\Delta f_1$ and $\Delta_2$ of said first and second resonance frequencies $f_{\Delta T,1}$ and $f_{\Delta T,2}$ that occur due to the temperature variation ΔT.

The temperature-sensing module 30 is configured to implement the expression discussed previously for the measurement of the temperature variation ΔT as a function of the difference between the frequency variations $\Delta f_1$ and $\Delta_2$ associated with a pair of vibrational modes of the micromechanical resonant structure 22 (e.g., to the first and second vibrational modes), and thus generate at output a measurement signal $S_{\Delta T}$ indicative of the measurement of temperature variation $\Delta T$.

The electronic processing circuit 24 further includes a compensation module 32, coupled to the output of the first resonant loop 24a for receiving the first output signal $S(f_{\Delta T,1})$ at the first resonance frequency $f_{\Delta T,1}$, and further coupled to the output of the temperature-sensing module 30 for receiving the measurement signal $S_{\Delta T}$ indicative of the measurement of temperature variation $T$.

The compensation module 32 is configured to correct, or compensate, with respect to the measured temperature variation $\Delta T$, the value of the first resonance frequency $f_{\Delta T,1}$ so as to obtain at the output a clock signal CLK at a desired frequency, which is a function of the correct value of resonance frequency and is stable in regard to variations of the operating temperature $T$.

Figure 8:
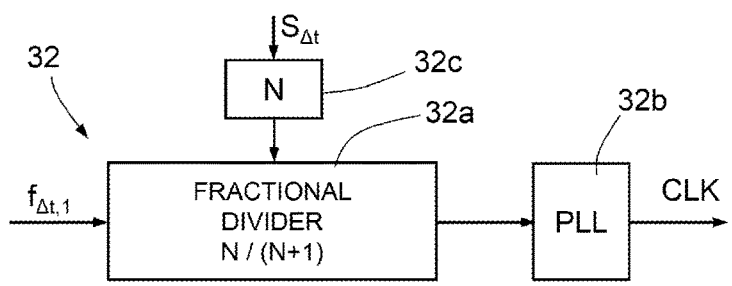
FIG. 8 is a schematic block diagram of a compensation module in the MEMS resonator system of FIG. 7.

In a possible implementation, illustrated in FIG. 8, the compensation module 32 includes: a frequency-divider stage 32a, in particular a fractional frequency divider N/(N+1) (of a per se known type and not described in detail herein), which is designed to generate an operating frequency that is a fractional multiple (or submultiple) of the first resonance frequency $f_1$, on the basis of a division factor N; and a PLL (Phase-Locked Loop) stage 32b, designed to generate at the output the clock signal CLK at the desired operating frequency (e.g., at a stable value of 32.768 kHz, starting from a value of the first resonance frequency $f_1$ of 524 kHz).

In particular, according to one aspect of the present solution, the division factor N of the frequency-divider stage 32a is determined in a determination stage 32c, coupled to the frequency-divider module 32a, as a function of the measured temperature variation $\Delta T$.

Figure 9:
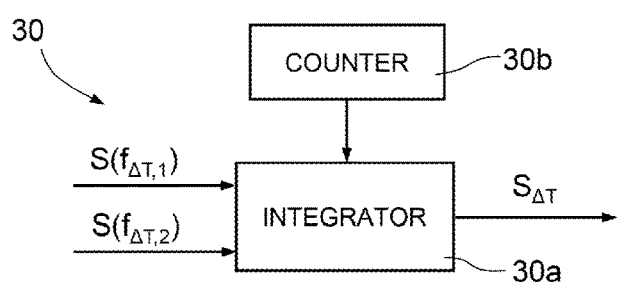
FIG. 9 is a schematic block diagram of a temperature-sensing module in the MEMS resonator system of FIG. 7.

With reference first to FIG. 9 a possible implementation of the temperature-sensing module 30 is now described.

The temperature-sensing module 30 includes: an integrator stage 30a, which receives at its input the first and second output signals $S(f_{\Delta T,1})$, $S(f_{\Delta T,2})$ at the first and second resonance frequencies $f_{\Delta T,1}$ and $f_{\Delta T,2}$; and a counter 30b, operatively coupled to the integrator stage 30a.

Figure 10A:
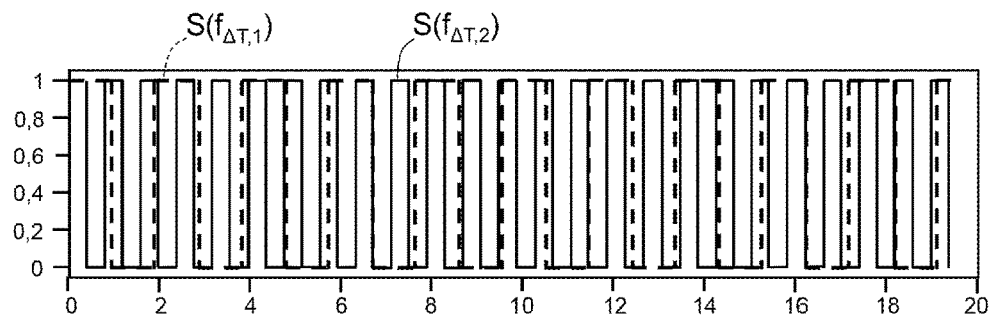
FIGS. 10A-10C show diagrams of electrical quantities relating to operation of the MEMS resonator system of FIG. 7.

As illustrated in FIG. 10A, the first and second output signals $S(f_{\Delta T,1})$, $S(f_{\Delta T,2})$ are, in the example, pulse trains at the respective first and second resonance frequencies $f_{\Delta T,1}$ and $f_{\Delta T,2}$ and undergo different frequency variations $\Delta f_1$ and $\Delta f_2$, as a function of the operating temperature $T$.

The integrator stage 30a is configured to: integrate (e.g., with positive integration starting from an initial level) the output signal $S(f_{\Delta T,1})$ at the first resonance frequency $f_{\Delta T,1}$ for a first time interval, counted as a first number of periods $N_1$ of the signal (the count being made by the counter 30b); and, subsequently, integrate (in the example with negative integration) the output signal $S(f_{\Delta T,2})$ at the second resonance frequency $f_{\Delta T,2}$ for a second time interval, counted as a second number of periods $N_2$ of the signal (the count again being made by the counter 30b). The second number of periods $N_2$ may possibly, but not necessarily, be equal to the first number of periods $N_1$.

Figure 10B:
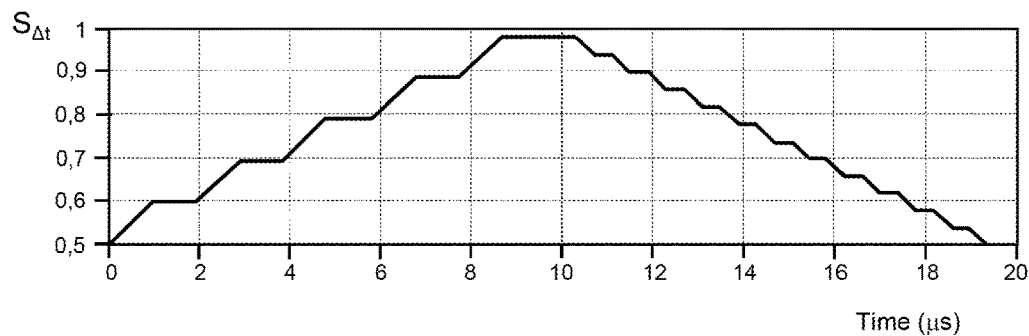

FIG. 10B shows the signal resulting from the aforesaid consecutive operations of positive and negative integration (considering an ideal condition, at the reference operating temperature).

In this embodiment, the level of the aforesaid resulting signal, at the end of the negative integration, represents the measurement signal $S_{\Delta T}$, indicative of the measured value of the temperature variation $\Delta T$, which is supplied at the output to the compensation module 32.

It should be noted that, in a possible implementation, the integration operations may be carried out in a substantially analog manner, by selective supply of a reference current for charging a capacitor starting from an initial charge level, this supply being enabled/disabled as a function of the value of the output signal $S(f_{\Delta T,1})$, $S(f_{\Delta T,2})$ to be integrated. In particular, at each cycle, charge (or discharge) of the capacitor is brought about during the ON phase of the duty cycle of the output signal to be integrated, whereas during the OFF phase of the same duty cycle the value reached at the end of the previous step is maintained.

Figure 10C:
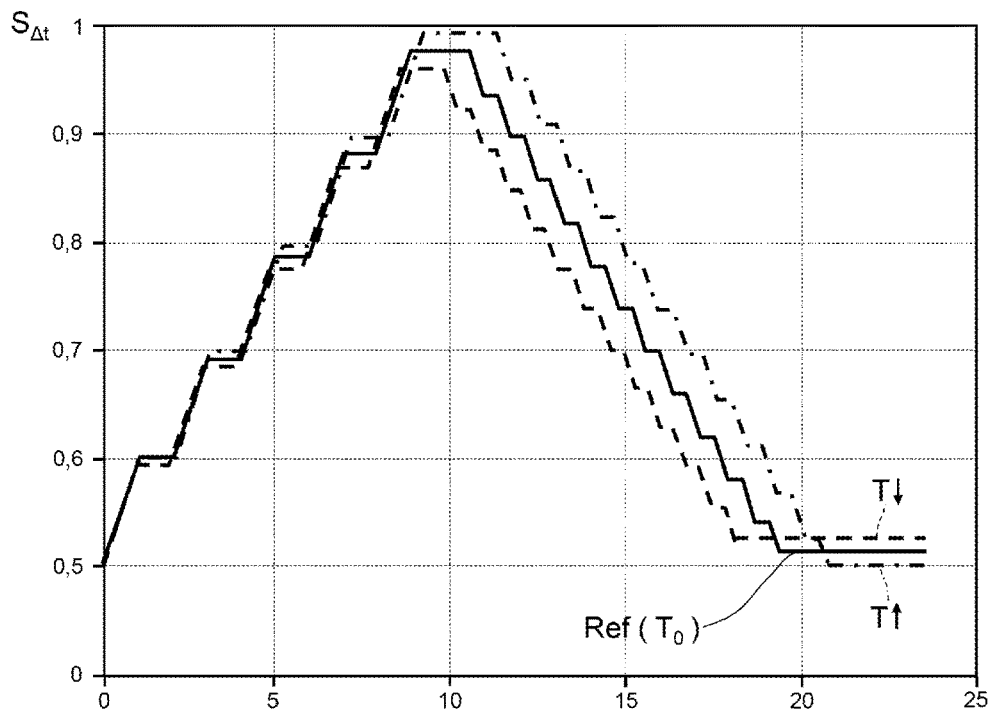

As illustrated in FIG. 10C, in the event of variation of the operating temperature $T$, on account of the different frequency variations $\Delta f_1$ and $\Delta f_2$ of the first and second resonance frequencies $f_{\Delta T,1}$ and $f_{\Delta T,2}$, the level of the measurement signal $S_{\Delta T}$ (resulting from the aforesaid combination of the operations of positive and negative integration) varies with respect to a reference level associated with the reference temperature $T_0$ (designated by Ref), it being, for example, higher than said reference level in the case of a negative temperature variation $\Delta T$ of the operating temperature $T$ with respect to the reference temperature $T_0$, or else lower than the same reference level in the case of a positive temperature variation $\Delta T$ of the operating temperature $T$ with respect to the reference temperature $T_0$.

The operation of measurement of the temperature variation $\Delta T$ that has just been described may advantageously be consecutively repeated for a given number of times, to further increase the precision of temperature measurement.

Figure 11:
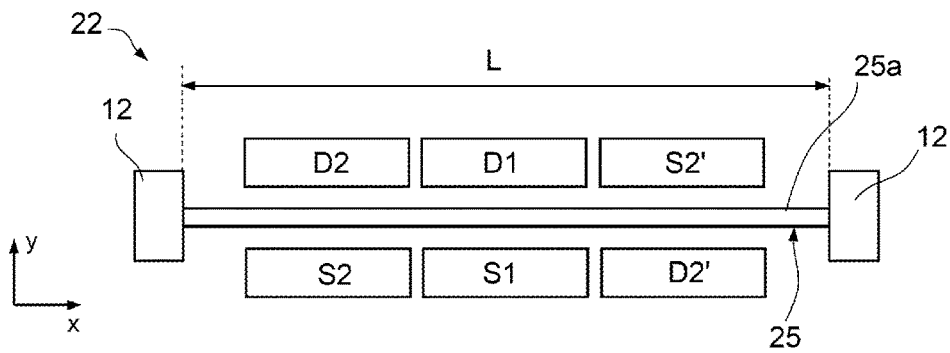
FIG. 11 is a schematic representation, in top plan view, of a micromechanical resonant structure of the MEMS resonator system of FIG. 7.

With reference first to FIG. 11, a possible embodiment of the micromechanical resonant structure 22 is now described, which enables effective decoupling of the first and second vibrational modes of the corresponding mobile structure 25.

Figure 2:
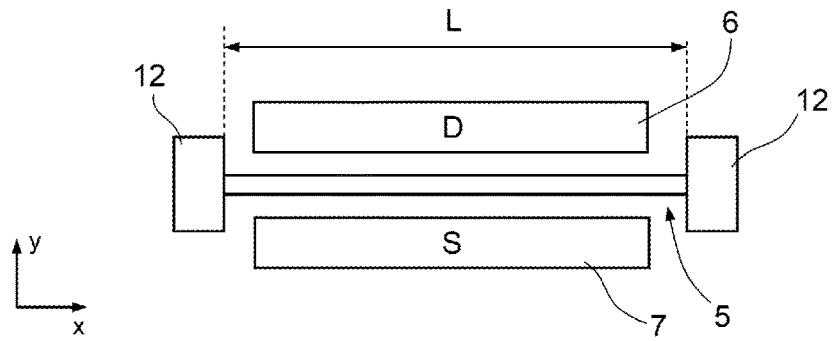
FIG. 2 is a schematic representation, in top plan view, of a micromechanical resonant structure of a MEMS resonator system, which is also of a known type.
Figure 3:
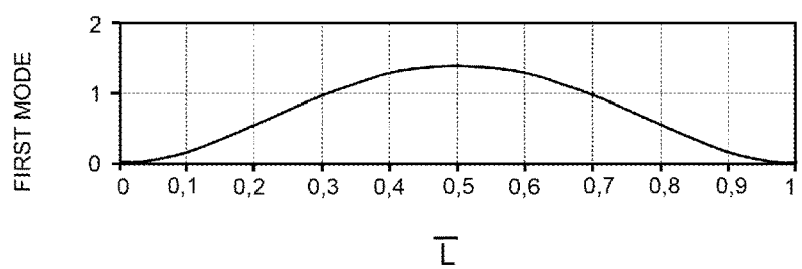
FIG. 3 is a diagram representing the first vibrational mode of the micromechanical resonant structure of FIG. 2.

In particular, in this implementation provided by way of example, the mobile structure 25 is defined by a single mobile mass, designated by 25a, constituted by a beam with both of its ends constrained at anchorages 12 that are fixed with respect to the substrate (substantially as described previously, with reference to FIG. 2).

The drive electrodes 26 and sense electrodes 27 of the first and second arrangements of electrodes associated, respectively, to the first and second resonant loops 24a, 24b of the electronic processing circuit 24 are in this case capacitively coupled to the same, single, mobile mass 25a of the mobile structure 25.

In particular, the first arrangement of drive electrodes 26 in this case includes a drive electrode, designated by D1, facing a central portion of the mobile mass 25a. Likewise, the first arrangement of sense electrodes includes a sense electrode S1, facing the same central portion of the mobile mass 25a, on the opposite side with respect to the drive electrode D1 along the second horizontal axis y.

The second arrangement of drive electrodes includes: a first drive electrode, designated by D2, facing a first lateral portion, or end portion, of the mobile mass 25a; and a second drive electrode, designated by D2', facing a second lateral portion, or end portion, of the mobile mass 25a (longitudinally opposite to the first end along the first horizontal axis x), on the opposite side along the second horizontal axis y with respect to the first drive electrode D2.

Likewise, the second arrangement of sense electrodes includes: a first sense electrode, designated by S2, facing the first lateral portion of the mobile mass 25a, on the opposite side with respect to the first drive electrode D2 along the second horizontal axis y; and a second sense electrode, designated by S2', facing the second lateral portion of the mobile mass 25a, on the opposite side along the second horizontal axis y with respect to the second drive electrode D2'.

The first and second drive electrodes D2, D2' of the second arrangement of drive electrodes are short-circuited with one another, like are the first and second sense electrodes S2, S2' of the second arrangement of sense electrodes.

Figure 12A:
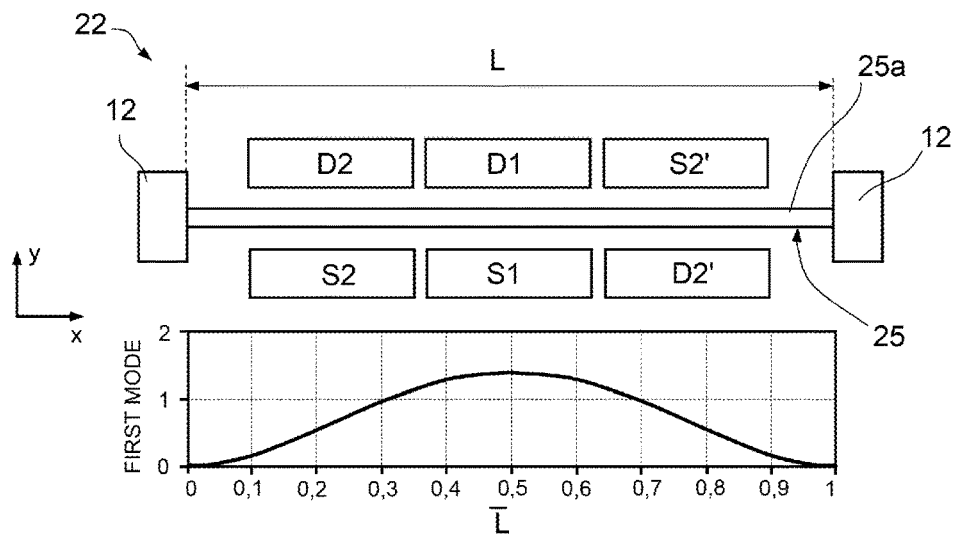
FIGS. 12A-12B show diagrams representing the first vibrational mode and the second vibrational mode, respectively, of the micromechanical resonant structure of FIG. 11.
Figure 12B:
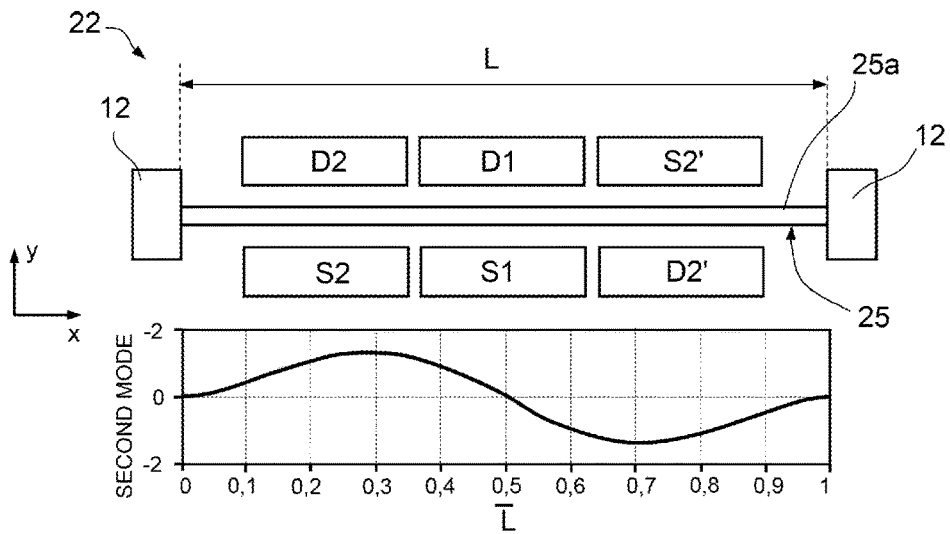

Advantageously, and as is evident from an examination of FIGS. 12A and 12B (wherein the first vibrational mode and the second vibrational mode, respectively, of the mobile structure 25 are represented, by way of example), the resulting arrangement of the drive electrodes 26 and of the sense electrodes 27 is such that the first resonant loop 24a is able to excite (and detect) exclusively and independently only the first vibrational mode, and likewise the second resonant loop 24b is able to excite (and detect) exclusively and independently only the second vibrational mode of the mobile structure 25.

In fact, the drive and sense electrodes D1, S1 associated with the first resonant loop 24a are arranged in a central position, at the point of maximum displacement associated with the first vibrational mode and of zero displacement associated with the second vibrational mode (second-order effects due to non-linearity are assumed as being negligible).

Likewise, the drive electrodes D2, D2' and the sense electrodes S2, S2' associated with the second resonant loop 24b are arranged in a lateral position so as to detect jointly a maximum capacitive variation for the second vibrational mode and a substantially zero capacitive variation for the first vibrational mode.

Figure 13:
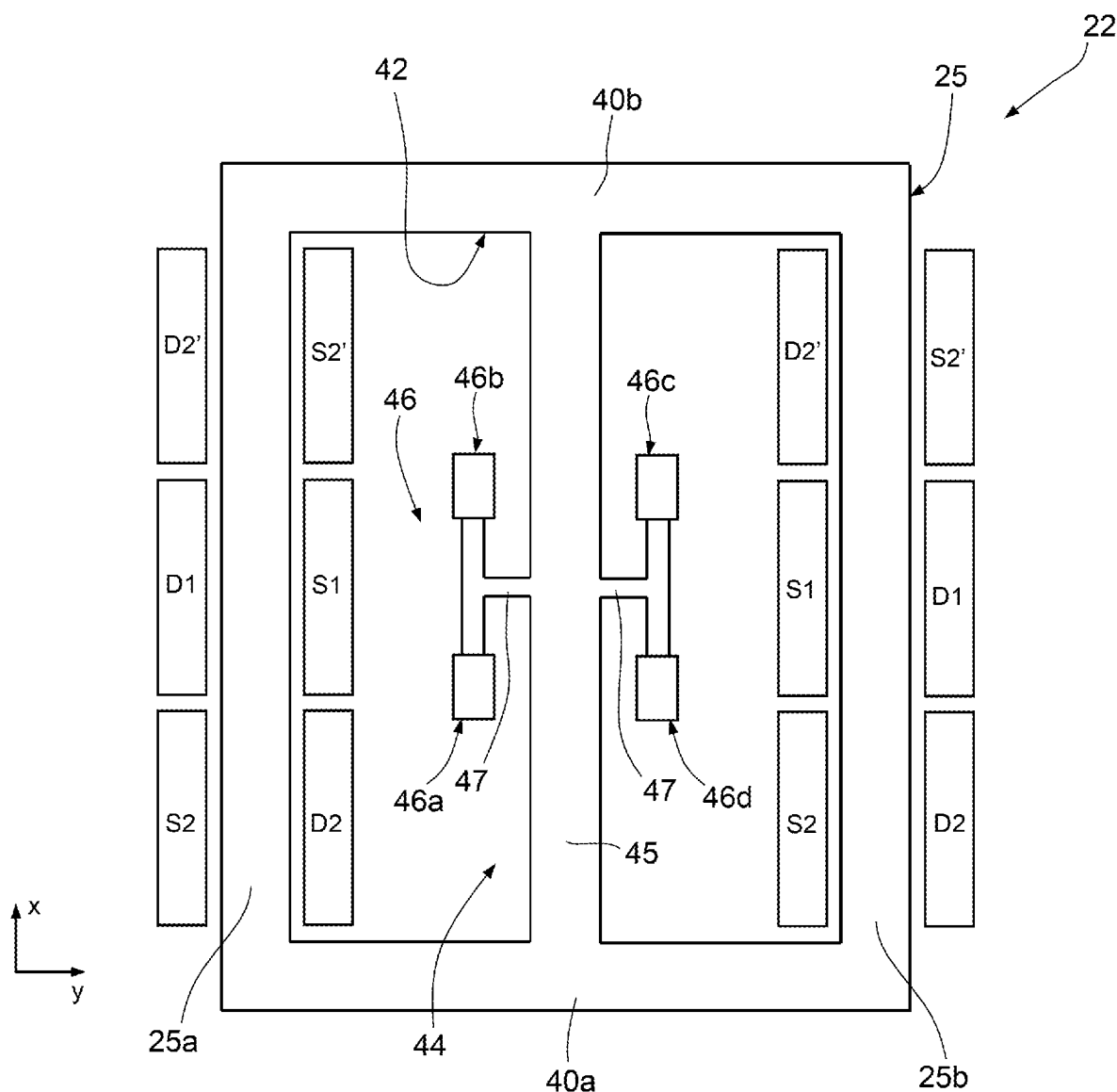
FIG. 13 is a schematic representation, in top plan view, of a micromechanical resonant structure of the MEMS resonator system of FIG. 7, according to a further embodiment.

With reference to FIG. 13, a further embodiment of the micromechanical resonant structure 22 is now described, which further enables, by a differential or phase-opposition configuration, an effective rejection of external disturbance effects (such as undesirable accelerations, warping, or swelling of the substrate due to heat or humidity) on the electrical performance of MEMS resonator system 20.

In this embodiment, the mobile structure 25 includes a first mobile mass 25a and a second mobile mass 25b, which are constituted by a respective first deflecting beam and second deflecting beam with longitudinal extension, constrained at both of the respective ends.

The first and second deflecting beams are connected at a first end thereof by a first connection element 40a, which has an extension transverse to the longitudinal extension of the beams, and at a second end thereof by a second connection element 40b, which also has a transverse extension and is parallel to the first connection element 40a.

The mobile structure 25 defines within it a window 42, having a substantially rectangular shape in the horizontal plane xy.

The mobile structure 25 is suspended above the substrate by a suspension structure 44, which includes a suspension beam 45, which is arranged centrally within the window 42 and in the example extends parallel to the first and second deflecting beams, from a central portion of the first connection element 40a to a corresponding central portion of the second connection element 40b.

The suspension structure 44 further includes an anchorage arrangement 46 constituted by a number (greater than or equal to one) of anchorages, arranged within the window 42 and fixed with respect to the substrate, to which the suspension arm 45 is rigidly connected.

In the embodiment illustrated in the aforesaid FIG. 13, the anchorage arrangement 46 includes a first anchorage 46a, a second anchorage 46b, a third anchorage 46c, and a fourth anchorage 46d, for example constituted by respective pillar or column elements that extend vertically as far as the substrate.

Further, the suspension structure 44 includes connection elements 47, shaped like a T, which are also arranged within the window 42 and are designed to connect the suspension beam 45 fixedly to the anchorages of the anchorage arrangement 46.

In this embodiment, respective arrangements of drive and sense electrodes are associated with the first and second mobile masses 25a and 25b, configured in a way altogether similar to what has been described with reference to FIG. 11.

In particular, in a way not illustrated, the corresponding drive electrodes 26 and the corresponding sense electrodes 27 associated with the first and second mobile masses 25a, 25b are electrically shorted to one another.

Figure 14:
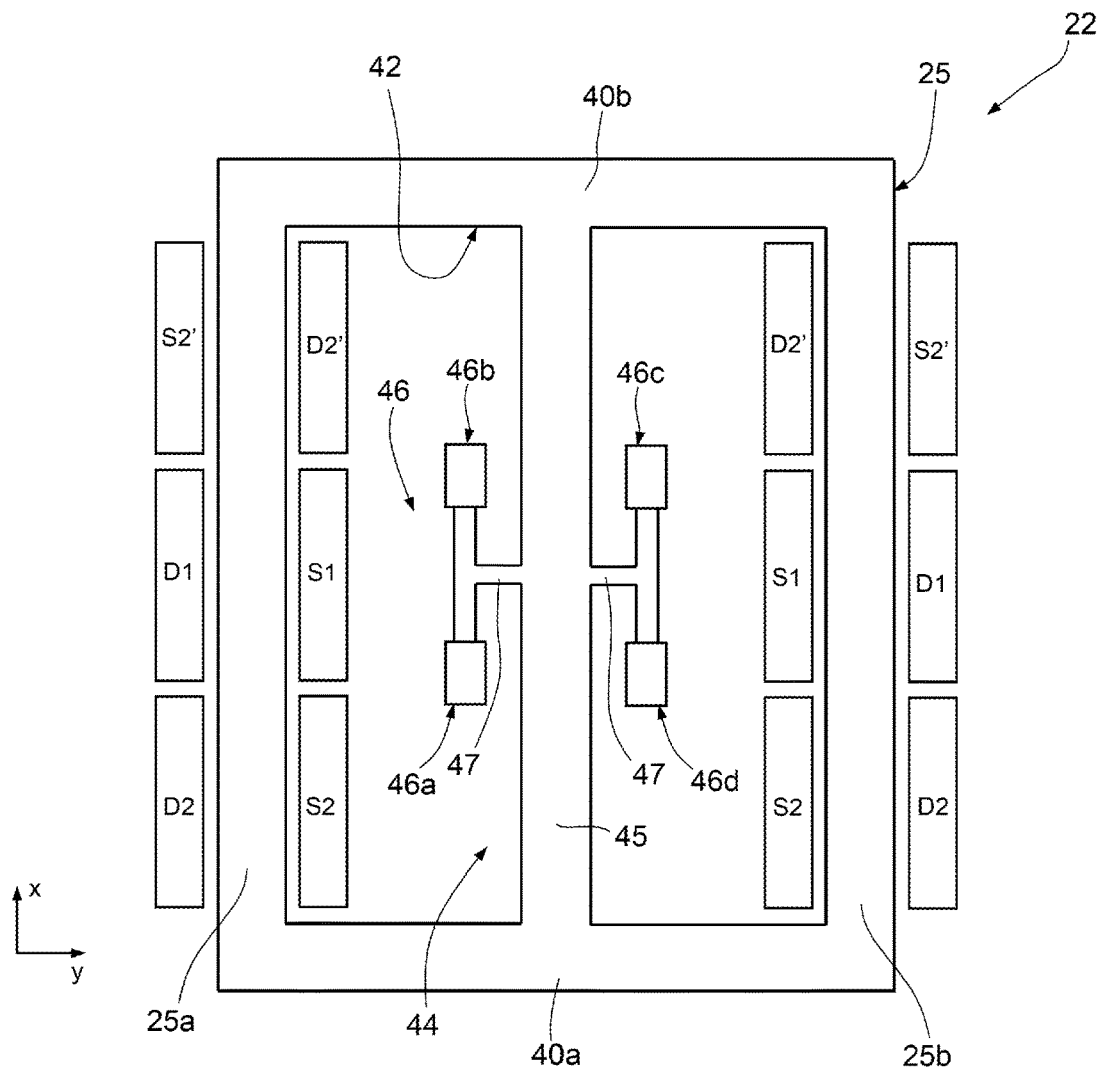
FIG. 14 is a schematic representation, in top plan view, of a micromechanical resonant structure, according to yet a further embodiment.

FIG. 14 shows a different arrangement of the drive and sense electrodes, which enables the same effects discussed previously to be obtained; in particular, a different mutual arrangement of the drive electrodes D2, D2' and sense electrodes S2, S2' associated with the mobile mass 25a may be noted.

The advantages of the solution described emerge clearly from the foregoing description.

In any case, it is again emphasised that the above solution enables improved electrical characteristics to be obtained, in particular as regards stability of the value of the resonance frequency and of the associated clock frequency versus temperature.

It is again highlighted that the solution described does not require, for the operation of compensation of the resonance frequency of the mobile structure as the temperature varies, use of an external and additional temperature sensor associated with the electronic processing circuit of the MEMS resonant system; the temperature information is in fact obtained from the movement of the mobile structure of the MEMS resonant system. It is in this way possible to avoid problems linked to the possible differences in temperature between an external temperature sensor and the mobile structure.

Further, the solution described does not require a substantial increase in the consumption of electrical energy of the MEMS resonator system.

The above MEMS resonator system 20 may thus advantageously replace traditional quartz resonant structures in the oscillator circuits, for example for RTC devices in portable electronic apparatuses.

Figure 15:
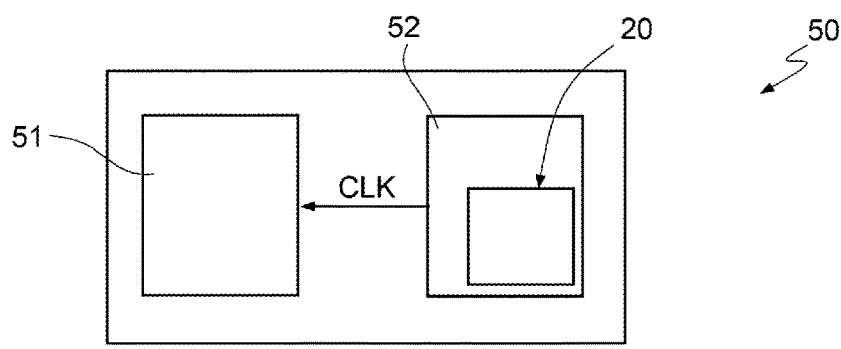
FIG. 15 is a general block diagram of an RTC device using the MEMS resonator system, according to a further aspect of the present solution.

In this regard, FIG. 15 is a schematic illustration of an electronic apparatus 50, which includes an application circuit 51, designed to carry out one or more applications that require timing by a clock signal CLK; and a timing circuit 52, designed to supply the clock signal CLK to the application circuit 51.

In particular, the timing circuit 52 includes the MEMS resonator system 20 described previously.

Finally, it is clear that modifications and variations may be made to what has been described and illustrated herein, without thereby departing from the scope of the present disclosure, as defined in the annexed claims.

In particular, it is highlighted that the resonance frequencies, the variations of which are used for measuring the temperature for compensation purposes, could be associated with different vibrational modes of the mobile structure, for example to the first and third vibrational modes (or to the second and third vibrational modes, or else again to higher vibrational modes).

Likewise, different arrangements of the drive and sense electrodes could be envisaged, which may in any case enable a substantial decoupling of the associated first and second resonant loops in the electronic processing circuit.

Also, the modes of constraint of the mobile structure could be different from what has been illustrated.

Further, a different implementation of the compensation module and/or of the temperature-sensing module of the electronic processing circuit could be envisaged, as compared to what has been previously illustrated by way of example.

Finally, it is pointed out that the MEMS resonator system described may advantageously be used in several further applications, different from the real-time clock application to which reference has been made previously, for example in high-frequency reference oscillators.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety, to the extent not inconsistent with the teachings and definitions of the present application. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A micro-electro-mechanical structure (MEMS) resonator system, comprising:
a micromechanical resonant structure including:
a mobile mass;
a first arrangement of drive electrodes;
a second arrangement of drive electrodes distinct from the first arrangement of drive electrodes;
a first arrangement of sense electrodes capacitively coupled to the mobile mass; and
a second arrangement of sense electrodes distinct from the second arrangement of drive electrodes and capacitively coupled to the mobile mass; and
an electronic processing circuit coupled to the micromechanical resonant structure, the electronic processing circuit including:
a first resonant loop configured to excite a first vibrational mode of the mobile mass and to generate a first signal at a first resonance frequency, the first vibrational mode being excited by the first arrangement of drive electrodes, the first signal being generated by the first arrangement of sense electrodes;
a second resonant loop configured to excite a second vibrational mode of the mobile mass and to generate a second signal at a second resonance frequency, the second vibrational mode being excited by the second arrangement of drive electrodes, the second signal being generated by the second arrangement of sense electrodes;
a temperature-sensing module configured to receive the first signal and the second signal and to generate a measurement of temperature variation as a function of a first variation of the first resonance frequency and as a function of a second variation of the second resonance frequency; and
a compensation module configured to receive the first signal and to compensate, as a function of the measurement of temperature variation, the first variation of the first resonance frequency caused by the temperature variation to generate a clock signal at a desired frequency that is a function of the first resonance frequency.

2. The MEMS resonator system according to claim 1, wherein the temperature-sensing module is configured to generate the measurement of temperature variation as a function of a difference between the first variation of the first resonance frequency and the second variation of the second resonance frequency.

3. The MEMS resonator system according to claim 2, wherein the temperature-sensing module is configured to generate the measurement of temperature variation, according to the expression:

$$\Delta T = \frac{\Delta f_1 - \Delta f_2}{\alpha \cdot (f_{0,1} - f_{0,2})}$$

wherein: $\Delta T$ is the temperature variation; $\Delta f_1$ is the first variation of the first resonance frequency; $\Delta f_2$ is the second variation of the second resonance frequency; $\alpha$ is associated with a temperature coefficient of frequency of a material of the micromechanical resonant structure; $f_{0,1}$ is a reference value of the first resonance frequency at a reference temperature; and $f_{0,2}$ is a respective reference value of the second resonance frequency at the reference temperature.

4. The MEMS resonator system according to claim 1, wherein the first and second vibrational modes correspond to two different modes of the micromechanical resonant structure.

5. The MEMS resonator system according to claim 4, wherein the first resonant loop includes a first amplifier stage configured to receive a first sensing signal from the first arrangement of sense electrodes, the second resonant loop includes a second amplifier stage configured to receive a second sensing signal from the second arrangement of sense electrodes, the first amplifier stage is configured to generate the first signal at the first resonance frequency, the second amplifier stage is configured to generate the second signal at the second resonance frequency, and the first and second signals define respective AC driving signals for sustaining, in a positive feedback, a resonant vibration of the micromechanical resonant structure.

6. The MEMS resonator system according to claim 1, wherein the temperature-sensing module comprises an integrator stage configured to integrate the first signal at the first resonance frequency for a first time interval, and configured to integrate the second signal at the second resonance frequency for a second time interval, and the temperature-sensing module configured to generate a signal indicative of the measurement of temperature variation based on the integration of the first and second signals.

7. The MEMS resonator system according to claim 1, wherein the compensation module comprises a frequency-divider stage configured to generate the desired frequency of the clock signal as a fractional multiple, or submultiple, of the first resonance frequency based on a division factor that is a function of the measurement of temperature variation.

8. The MEMS resonator system according to claim 1,
wherein the first arrangement of drive electrodes includes a drive electrode facing a central portion of the mobile mass;
wherein the first arrangement of sense electrodes includes a sense electrode facing a central portion of the mobile mass and on an opposite side of the central portion of the mobile mass with respect to the drive electrode;
wherein the second arrangement of drive electrodes includes a first drive electrode facing a first lateral portion of the mobile mass, and a second drive electrode facing a second lateral portion of the mobile mass longitudinally opposite to the first lateral portion, the second drive electrode being on the opposite side of the mobile mass with respect to the first drive electrode; and
wherein the second arrangement of sense electrodes includes a first sense electrode facing the first lateral portion of the mobile mass and on the opposite side of the mobile mass with respect to the first drive electrode, and a second sense electrode facing the second lateral portion of the mobile mass and on the opposite side of the mobile mass with respect to the second drive electrode.

9. A timing circuit, comprising:
a micro-electro-mechanical structure (MEMS) resonator system including:
a micromechanical resonant structure including:
a mobile mass;
first, second, and third drive electrodes capacitively coupled to the mobile mass; and
first, second, and third sense electrodes capacitively coupled to the mobile mass, the first, second, and third drive electrodes being spaced from the first, second, and third sense electrodes, respectively, by the mobile mass, the first drive electrode being positioned between the second drive electrode and the third sense electrode, the first sense electrode being positioned between the second sense electrode and the third drive electrode; and
an electronic processing circuit coupled to the micromechanical resonant structure, the electronic processing circuit including:
a first resonant loop circuit that in operation excites a first vibrational mode of the mobile mass and generates a first signal at a first resonance frequency based on the first vibrational mode, the first resonance frequency having a value that is a function of a temperature, the first resonant loop circuit including the first drive electrode and the first sense electrode;
a second resonant loop circuit that in operation excites a second vibrational mode of the mobile mass and generates a second signal at a second resonance frequency based on the second vibrational mode, the second resonance frequency having a value that is a function of temperature, the second resonant loop circuit including the second and third drive electrodes and the second and third sense electrodes;
a temperature-sensing circuit coupled to the first and second resonant loop circuits to receive the first signal and the second signal and that in operation generates a measurement signal indicating a temperature variation as a function of a first variation of the first resonance frequency and a second variation of the second resonance frequency; and
a compensation circuit coupled to the temperature-sensing circuit to receive the measurement signal and coupled to the first resonant loop circuit to receive the first signal, and the compensation circuit in operation generates a clock signal having an operating frequency based on the first signal and adjusts generation of the clock signal as a function of the measurement signal to maintain the clock signal at the operation frequency in response to variation in the value of the first resonance frequency of the first signal as a function of temperature.

10. The timing circuit of claim 9, wherein the temperature-sensing circuit in operation generates the measurement signal as a function of a difference between the first variation of the first resonance frequency and the second variation of the second resonance frequency.

11. The MEMS resonator system according to claim 10, wherein the temperature-sensing circuit in operation generates the measurement signal based on the expression:

$$\Delta T = \frac{\Delta f_1 - \Delta f_2}{\alpha \cdot (f_{0,1} - f_{0,2})}$$

wherein: $\Delta T$ is the temperature variation; $\Delta f_1$ is the first variation of the first resonance frequency; $\Delta f_2$ is the second variation of the second resonance frequency; $\alpha$ is associated with a temperature coefficient of frequency of a material of the micromechanical resonant structure; $f_{0,1}$ is a reference value of the first resonance frequency at a reference temperature; and $f_{0,2}$ is a respective reference value of the second resonance frequency at the reference temperature.

12. The MEMS resonator system according to claim 9, wherein the compensation circuit comprises a fractional frequency divider circuit coupled to receive the first signal and a phase-locked loop coupled to the fractional frequency divider circuit.

13. The MEMS resonator system of claim 9, wherein the micromechanical resonant structure comprises a clamped-type resonant structure.

14. A method, comprising:
exciting, by a first resonant loop of an electronic processing circuit, a first vibrational mode of a mobile mass of a micromechanical resonant structure, the micromechanical resonant structure including:
the mobile mass;
a first arrangement of drive electrodes;
a second arrangement of drive electrodes distinct from the first arrangement of drive electrodes;
a first arrangement of sense electrodes capacitively coupled to the mobile mass; and
a second arrangement of sense electrodes distinct from the second arrangement of drive electrodes and capacitively coupled to the mobile mass;
generating, by the first resonant loop, a first signal at a first resonance frequency the first vibrational mode being excited by the first arrangement of drive electrodes, the first signal being generated by the first arrangement of sense electrodes;

exciting, by a second resonant loop of the electronic processing circuit, a second vibrational mode of the mobile mass of the micromechanical resonant structure;

generating, by the second resonant loop, a second signal at a second resonance frequency, the second vibrational mode being excited by the second arrangement of drive electrodes, the second signal being generated by the second arrangement of sense electrodes;

receiving, by a temperature-sensing module of the electronic processing circuit, the first signal and the second signal;

generating, by the temperature-sensing module, a measurement of temperature variation as a function of a first variation of the first resonance frequency and as function of a second variation of the second resonance frequency;

receiving, by a compensation module of the electronic processing circuit, the first signal;

compensating, by the compensation module and as a function of the measurement of temperature variation, the first variation of the first resonance frequency caused by the temperature variation; and generating, by the compensation module, a clock signal at a desired frequency that is a function of the first resonance frequency.

15. The method according to claim 14, wherein generating the measurement of temperature variation further includes generating the measurement of temperature variation as a function of a difference between the first variation of the first resonance frequency and the second variation of the second resonance frequency.

16. The method according to claim 15, wherein generating the measurement of temperature variation includes generating the measurement of temperature variation according to the expression:

$$\Delta T = \frac{\Delta f_1 - \Delta f_2}{\alpha \cdot (f_{0,1} - f_{0,2})}$$

wherein: $\Delta T$ is the temperature variation; $\Delta f_1$ is the first variation of the first resonance frequency; $\Delta f_2$ is the second variation of the second resonance frequency; $\alpha$ is associated with a temperature coefficient of frequency of the material of the micromechanical resonant structure; $f_{0,1}$ is a reference value of the first resonance frequency at a reference temperature; and $f_{0,2}$ is a respective reference value of the second resonance frequency at the reference temperature.

17. The method according to claim 14, further comprising:

integrating, by an integrator stage, the first signal at the first resonance frequency for a first time interval;

integrating, by an integrator stage, the second signal at the second resonance frequency for a second time interval after the first time interval; and generating, by the temperature-sensing module, a signal indicative of the measurement of temperature variation based on the integration of the first and second signals.

18. The method according to claim 14, wherein generating the clock signal includes generating the desired frequency of the clock signal as a fractional multiple, or submultiple, of the first resonance frequency of the first signal based on a division factor that is a function of the measurement of temperature variation.

* * * * *